United States Patent
Pranatharthi Haran et al.

(10) Patent No.: US 11,152,464 B1
(45) Date of Patent: Oct. 19, 2021

(54) SELF-ALIGNED ISOLATION FOR NANOSHEET TRANSISTOR

(71) Applicant: International Business Machines Corporation, Armonk, NY (US)

(72) Inventors: Balasubramanian S. Pranatharthi Haran, Watervliet, NY (US); Ruilong Xie, Niskayuna, NY (US); Veeraraghavan S. Basker, Schenectady, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/832,047

(22) Filed: Mar. 27, 2020

(51) Int. Cl.
*H01L 29/06* (2006.01)
*H01L 29/786* (2006.01)
*H01L 29/66* (2006.01)
*H01L 29/10* (2006.01)

(52) U.S. Cl.
CPC ........ *H01L 29/068* (2013.01); *H01L 29/0649* (2013.01); *H01L 29/1037* (2013.01); *H01L 29/6656* (2013.01); *H01L 29/78696* (2013.01)

(58) Field of Classification Search
CPC .............. H01L 29/068; H01L 29/0649; H01L 29/6656; H01L 29/1037; H01L 29/78696
USPC .... 438/761, 151, 268, 284, 381; 257/24, 14, 257/9, 355, 369, 379, 734, 784, E21.409, 257/E21.41, E21.411, E21.538, E27.048, 257/E27.062, E29.081, E29.245, E29.274, 257/E29.296, E29.338
See application file for complete search history.

(56) References Cited

U.S. PATENT DOCUMENTS

| | | |
|---|---|---|
| 9,831,324 B1 | 11/2017 | Chao et al. |
| 9,960,077 B1 | 5/2018 | Zang et al. |
| 10,002,795 B1 | 6/2018 | Bi et al. |
| 10,068,987 B1 | 9/2018 | Zang |
| 10,242,920 B2 | 3/2019 | Guillorn et al. |
| 10,319,722 B2 | 6/2019 | Gluschenkov et al. |
| 10,326,002 B1 | 6/2019 | Zang et al. |
| 2016/0233298 A1 | 8/2016 | Webb et al. |
| 2017/0256544 A1* | 9/2017 | Chai ................. H01L 29/78696 |
| 2017/0278752 A1 | 9/2017 | Ryckaert et al. |
| 2018/0108770 A1 | 4/2018 | Cheng et al. |
| 2018/0248029 A1 | 8/2018 | Cheng |
| 2019/0035888 A1 | 1/2019 | Wu |
| 2020/0035567 A1* | 1/2020 | Chanemougame ......................... H01L 29/78654 |

(Continued)

FOREIGN PATENT DOCUMENTS

WO 2015094305 A1 6/2015

*Primary Examiner* — Dao H Nguyen
(74) *Attorney, Agent, or Firm* — Cantor Colburn LLP; Randall Bluestone

(57) ABSTRACT

Embodiments of the present invention are directed to methods and resulting structures for nanosheet devices having self-aligned isolations. In a non-limiting embodiment of the invention, a first gate stack is formed over channel regions of a first nanosheet stack. A second gate stack is formed over channel regions of a second nanosheet stack adjacent to the first nanosheet stack. An isolation pillar is positioned between the first gate stack and the second gate stack. The isolation pillar includes a top portion having a first width and a bottom portion having a second width less than the first width.

14 Claims, 11 Drawing Sheets

(56) References Cited

U.S. PATENT DOCUMENTS

2020/0243522 A1* 7/2020 Cheng ............ H01L 21/823842

* cited by examiner

SELF-ALIGNED ISOLATION FOR NANOSHEET TRANSISTOR

BACKGROUND

The present invention generally relates to fabrication methods and resulting structures for semiconductor devices, and more specifically, to an improved process and resulting structures for nanosheet transistors having self-aligned isolation regions.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs include a non-planar architecture that provides increased device density and some increased performance over lateral devices. In nanosheet FETs, in contrast to conventional planar FETs, the channel is implemented as a plurality of stacked and spaced apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL).

SUMMARY

Embodiments of the invention are directed to a method for forming a nanosheet device having self-aligned isolations. A non-limiting example of the method includes forming a first gate stack over channel regions of a first nanosheet stack. A second gate stack is formed over channel regions of a second nanosheet stack adjacent to the first nanosheet stack. An isolation pillar is positioned between the first gate stack and the second gate stack. The isolation pillar includes a top portion having a first width and a bottom portion having a second width less than the first width.

Embodiments of the invention are directed to a semiconductor structure. A non-limiting example of the semiconductor device includes an n-type gate stack over channel regions of a first nanosheet stack and a p-type gate stack over channel regions of a second nanosheet stack. The semiconductor device further includes an isolation pillar positioned between the n-type gate stack and the p-type gate stack. The isolation pillar includes a top portion having a first width and a bottom portion having a second width less than the first width.

Embodiments of the invention are directed to a semiconductor structure. A non-limiting example of the semiconductor device includes an n-type gate stack over channel regions of a first nanosheet stack and a p-type gate stack over channel regions of a second nanosheet stack. The semiconductor device further includes an isolation pillar positioned between the n-type gate stack and the p-type gate stack and a conductive structure on the isolation pillar. The conductive structure includes a top portion having a first width and a bottom portion having a second width less than the first width. The top portion extends over portions of the n-type gate stack and portions of the p-type gate stack.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
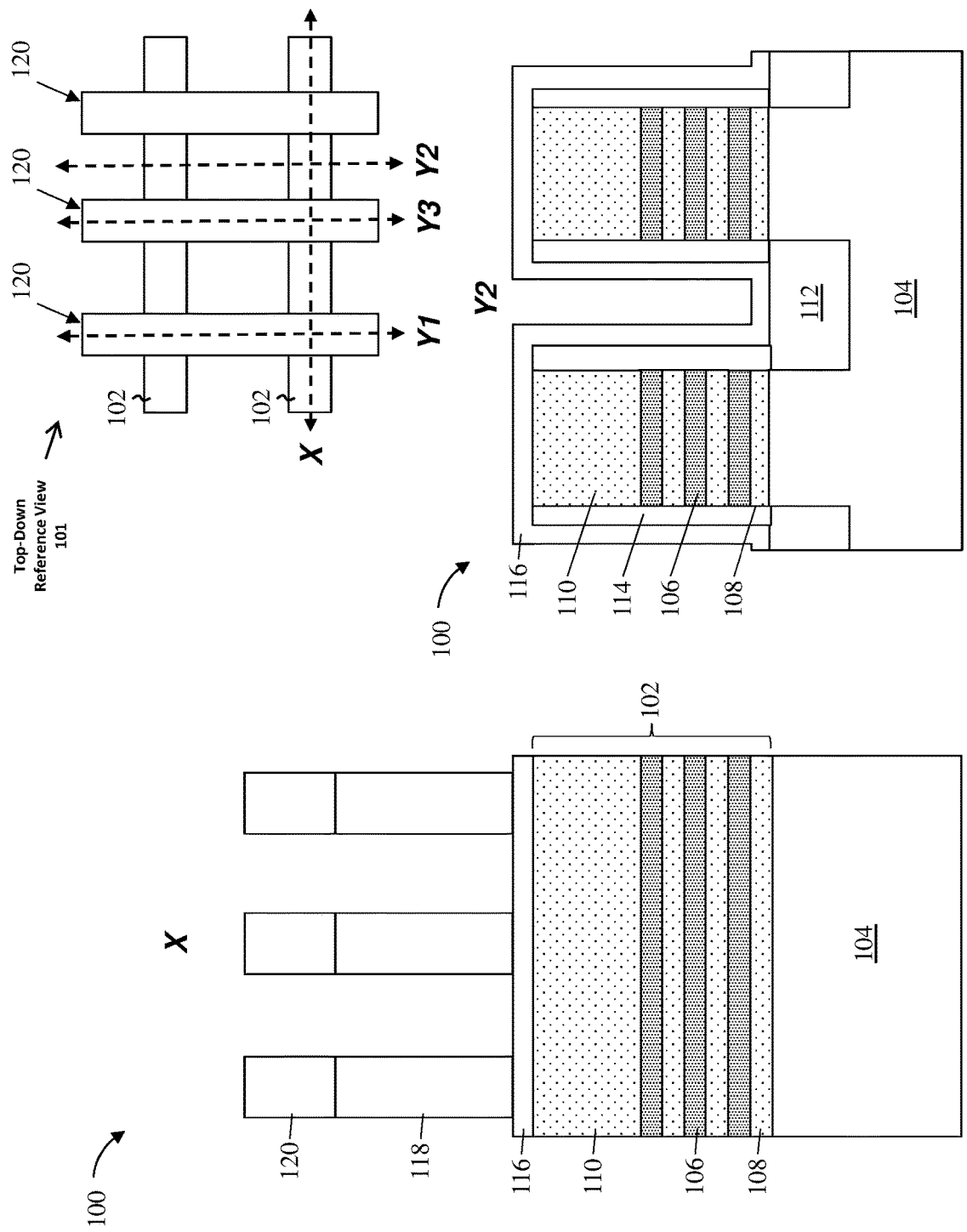
FIG. 1 depicts a top-down reference view, along with cross-sectional views of a semiconductor structure along the lines X and Y2 of the reference view after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed, wherein it is desirable to provide self-aligned isolation regions.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, continued scaling of nanosheet FETs is currently limited due to various factors, including limitations in work function metal patterning, parasitic capacitance, and gate cut patterning.

Work function metal patterning is directly limited due to the increasingly tight space between nanosheets, and now requires longer wet clean processes to fully remove undesirable metal. In particular, it is hard to remove P-type metals (e.g., Ga, B, $BF_2$, or Al) from N-type areas of the substrate without also inadvertently removing some P-type metal in P-type areas. For example, P-type metal can be removed from the P-type area when the organic planarization layer (OPL) block (or other mask) is accidentally undercut when removing P-type metals from the N-type area. This problem is even more challenging when the N-to-P space is reduced at smaller footprints or when the effective length (Weff) of the device increases (which serves to pinch off the space between nanosheets).

Parasitic capacitance is becoming a larger issue as nanosheet-based architectures continue scaling. One method to scale is to increase the height of the nanosheet stacks. Tall nanosheet stacks provide the same effective length at a smaller footprint, directly enabling area scaling. The price, however, is a relatively large increase in parasitic capacitance between the source/drain contact and gate that results from decreasing the spacing between the source/drain contact and gate.

Gate cut patterning is currently the bottleneck for CMOS scaling of nanosheet devices beyond the 5 nm technology node. In the ideal case, the gate cut is small (e.g., small critical dimension) and perfectly aligned (e.g., centered between the nanosheets positioned on opposite sides of the cut). In reality, however, the gate cut can be too large or misaligned, resulting in the gate extending from each nanosheet sidewall by a different amount, causing performance issues in the final device.

Turning now to an overview of aspects of the present invention, one or more embodiments of the invention address the above-described shortcomings of known nanosheet architectures and fabrication techniques by providing a new nanosheet semiconductor structure and a method of fabricating the same that uses a self-aligned isolation fabrication scheme that solves the above-described issues of work function metal patterning, parasitic capacitance, and gate cut patterning. In accordance with embodiments of the invention, a T-shaped structure is positioned between an NFET gate a PFET gate of adjacent nanosheet stacks. The T-shaped structure can provide isolation or shorting between the adjacent NFET gate and PFET gate, depending on the requirements of the underlying nanosheet stacks.

For "cut gate devices" that require isolation between NFET gate stacks and PFET gate stacks, a T-shaped dielectric isolation pillar is positioned between the NFET gate and PFET gate. The T-shaped dielectric pillar has a wider part on top and a narrower part at bottom (the so-called T-shape). In some embodiments of the invention, the T-shaped dielectric pillar is constructed to provide dimensions that are friendly to work function metal filling requirements. In short, the space (dimension "h") between the bottommost surface of the wider part of the T-shaped dielectric pillar and the topmost surface of the topmost nanosheet is larger than the space (dimension "b") between the nanosheet sidewall and the narrow part of the T-shaped dielectric pillar. Moreover, the space (dimension "b") between the nanosheet sidewall and the narrow part of the T-shaped dielectric pillar is larger than the space (dimension "a") between adjacent nanosheets.

For "shared-gate devices" the T-shaped dielectric isolation pillar is recessed such that the narrow part of the T-shaped dielectric pillar is all that remains, leaving behind a dielectric pillar. Because this dielectric pillar remains in both cut gate devices and shared-gate devices, the dielectric pillar is sometimes referred to separately as the global isolation pillar. A conductive (e.g., metal) T-shaped portion is then positioned on the recessed dielectric pillar. The conductive T-shaped portion shorts the NFET gate stack to the PFET gate stack.

A T-shaped structure formed in this manner offers several technical benefits. For example, a T-shaped dielectric pillar can be constructed to provide dimensions that are friendly to work function metal filling requirements. Additionally, the global isolation pillar helps reduce the contact-to-gate parasitic capacitance in both "cut gate" and "shared-gate" devices. Additionally, the self-aligned isolation afforded by the T-shaped structure enables precise alignment of the gate cut and extremely small gate cut critical dimensions for cell scaling.

Turning now to a more detailed description of fabrication operations and resulting structures according to aspects of the invention, FIGS. 1-10 depict a semiconductor structure 100 after various fabrication operations in accordance with aspects of the invention. Although the cross-sectional diagrams depicted in FIGS. 1-10 are two-dimensional, it is understood that the diagrams depicted in FIGS. 1-10 represent three-dimensional structures. The top-down reference view 101 shown in FIG. 1 provides a reference point for the various cross-sectional views: X-view (across gate in nanosheet region), Y1-view (along gates for cut gate device), Y2-view (across nanosheets in source/drain region), and Y3-view (along gates for shared gate device) shown in FIGS. 1-10.

FIG. 1 depicts cross-sectional views of the semiconductor structure 100 taken along the lines X and Y2 of the reference view 101 after an initial set of fabrication operations have been applied as part of a method of fabricating a final semiconductor device according to one or more embodiments of the invention. In some embodiments of the invention, one or more nanosheet stacks 102 are formed over a substrate 104.

The substrate 104 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 can include a buried oxide layer (not shown) in a silicon-on-insulator (SOI) configuration. The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, the nanosheet stacks 102 can include one or more semiconductor layers 106 alternating with one or more sacrificial layers 108. In some embodiments of the invention, the semiconductor layers 106 and the sacrificial layers 108 are epitaxially grown layers. For ease of discussion reference is made to operations performed on and to a nanosheet stack having three nanosheets (e.g., the three semiconductor layers 106 shown in FIG. 1) alternating with four sacrificial layers (e.g., the three sacrificial layers 108 and a topmost sacrificial layer 110). It is understood, however, that the nanosheet stacks 102 can include any number of nanosheets alternating with a corresponding number of sacrificial layers. For example, the nanosheet stacks 102 can include two nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets).

The semiconductor layers 106 can be made of any suitable material such as, for example, monocrystalline silicon or silicon germanium. In some embodiments of the invention, the semiconductor layers 106 are silicon nanosheets. In some embodiments of the invention, the semiconductor layers 106 have a thickness of about 4 nm to about 10 nm, for example 6 nm, although other thicknesses are within the contemplated scope of the invention. In some embodiments of the invention, the substrate 104 and the semiconductor layers 106 can be made of a same semiconductor material. In other embodiments of the invention, the substrate 104 can be made of a first semiconductor material, and the semiconductor layers 106 can be made of a second semiconductor material.

The sacrificial layers 108 and the topmost sacrificial layer 110 can be silicon or silicon germanium layers, depending on the material of the semiconductor layers 106 to meet etch selectivity requirements. For example, in embodiments where the semiconductor layers 106 are silicon nanosheets, the sacrificial layers 108 and 110 can be silicon germanium layers. In embodiments where the semiconductor layers 106 are silicon germanium nanosheets, the sacrificial layers 108 and 110 can be silicon germanium layers having a germanium concentration that is greater than the germanium concentration in the semiconductor layers 106. For example, if the semiconductor layers 106 are silicon germanium having a germanium concentration of 5 percent (sometimes referred to as SiGe5), the sacrificial layers 108 and 110 can be silicon germanium layers having a germanium concentration of about 25 (SiGe25), although other germanium concentrations are within the contemplated scope of the invention. In some embodiments of the invention, the sacrificial layers 108 have a thickness of about 8 nm to about 15 nm, for example 10 nm, although other thicknesses are within the contemplated scope of the invention. In some embodiments of the invention, the sacrificial layer 110 has a thickness greater than the sacrificial layers 108, for example, of about 20 nm to about 60 nm, although other thicknesses are within the contemplated scope of the invention.

As shown in the cross-sectional view Y2, a shallow trench isolation region 112 (also referred to as an STI region) can be formed adjacent to the nanosheet stacks 102. In some embodiments of the invention, a trench is formed by removing portions of the nanosheet stacks 102 and an exposed surface of the substrate 104 is recessed. The trench can then be filled with dielectric material, such as, a low-k dielectric, a nitride, silicon nitride, silicon oxide, SiON, SiC, SiOCN, or SiBCN. The shallow trench isolation region 112 provides electrical isolation between the nanosheet stacks 102 and other adjacent devices (such as other nanosheet stacks, or any other active device) on the substrate 104.

In some embodiments of the invention, a sacrificial spacer 114 is formed on sidewalls of the nanosheet stacks 102. In some embodiments of the invention, the sacrificial spacer 114 is formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, sacrificial spacer material can be conformally deposited over the semiconductor structure 100 and selectively removed using a RIE to form the sacrificial spacer 114. The sacrificial spacer material can include, for example, amorphous silicon germanium (a-SiGe), although other sacrificial materials are within the contemplated scope of the invention. In some embodiments of the invention, the sacrificial spacer 114 has a thickness of about 5 nm to about 15 nm, for example 10 nm, although other thicknesses are within the contemplated scope of the invention.

In some embodiments of the invention, a liner 116 is formed over the topmost sacrificial layer 110 and the shallow trench isolation 112. In some embodiments of the invention, the liner 116 is conformally deposited over the semiconductor structure 100 using, for example, ALD, although other conformal deposition processes are within the contemplated scope of the invention. The liner 116 can be made of any suitable material, such as, for example, a low-k dielectric or an oxide (e.g., SiO2). The liner 116 can be formed to a nominal (conformal) thickness of about 5 nm or less, or 3 nm or less, although other thicknesses are within the contemplated scope of the invention.

In some embodiments of the invention, one or more sacrificial gates 118 (sometimes referred to as dummy gates) are formed over the nanosheet stacks 102. The portion of a nanosheet stack over which a gate is formed is referred to as a channel region. The sacrificial gates 118 can be made of any suitable material, such as, for example, amorphous silicon or polysilicon. Any known method for patterning a sacrificial gate can be used, such as, for example, a wet etch, a dry etch, or a combination of sequential wet and/or dry etches.

In some embodiments of the invention, a hard mask 120 is formed on the sacrificial gates 118. In some embodiments of the invention, the sacrificial gates 118 are formed by patterning the hard mask 120 and using a wet or dry etch process to selectively remove portions of the sacrificial gates 118 which are not covered by the pattered hard mask 120.

The hard mask 120 can be made of any suitable material, such as, for example, a silicon nitride. In some embodiments of the invention, a second hard mask (not depicted) is formed on the hard mask 120 to form a bilayer hard mask. In some embodiments, the second hard mask includes an oxide, such as, for example, silicon dioxide.

Figure 2:
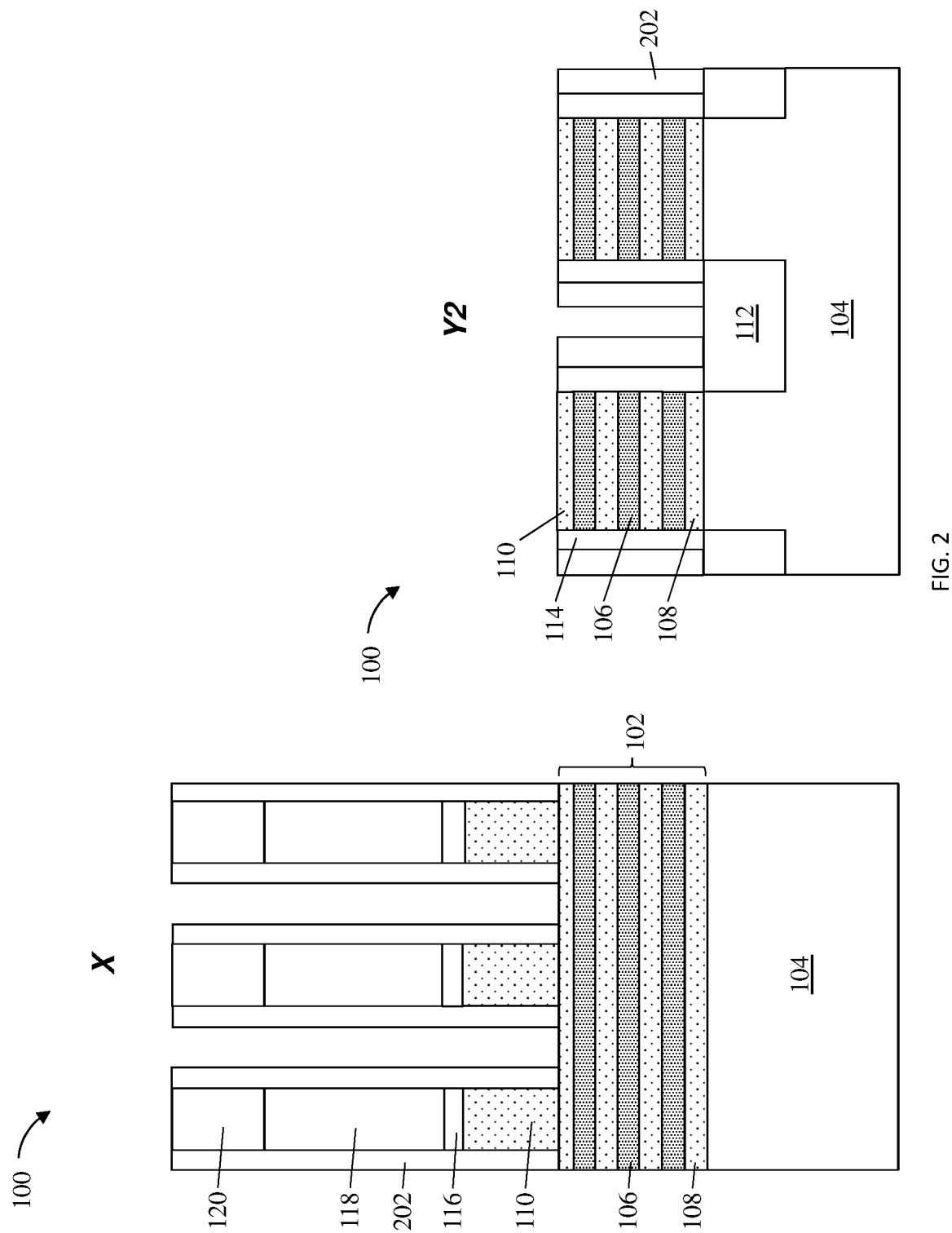
FIG. 2 depicts cross-sectional views of a semiconductor structure along the lines X and Y2 of the reference view after forming sidewall spacers according to one or more embodiments of the invention.

FIG. 2 depicts cross-sectional views of the semiconductor structure 100 taken along the lines X and Y2 of the reference view 101 after a processing operation according to one or more embodiments of the invention. In some embodiments of the invention, exposed portions (i.e., those portions not covered by the sacrificial gates 118) of the liner 116 are removed to expose a surface of the topmost sacrificial layer 110. The liner 116 can be patterned in this manner using any suitable process, such as, for example, a wet etch, a dry etch, or a combination of wet and/or dry etches. In some embodiments of the invention, the liner 116 is patterned using a RIE. In some embodiments of the invention, the RIE includes a hydrofluoric acid (HF) clean.

In some embodiments of the invention, the exposed surface of the topmost sacrificial layer 110 is recessed. The topmost sacrificial layer 110 can be recessed using any suitable process, such as, for example, a wet etch, a dry etch, or a combination of wet and/or dry etches. In some embodiments of the invention, the topmost sacrificial layer 110 is recessed to a thickness of about 2 nm to about 10 nm, for example 6 nm, although other thicknesses are within the contemplated scope of the invention.

As further shown in FIG. 2, in some embodiments of the invention, spacers 202 (also known as sidewall spacers or gate spacers) are formed on sidewalls of the sacrificial gates 118. In some embodiments of the invention, the spacers 202 are formed using CVD, PECVD, UHVCVD, RTCVD, MOCVD, LPCVD, LRPCVD, ALD, PVD, chemical solution deposition, MBE, or other like process in combination with a wet or dry etch process. For example, spacer material can be conformally deposited over the semiconductor structure 100 and selectively removed using a RIE to form the spacers 202.

The spacers 202 can be made of any suitable material, such as, for example, a low-k dielectric, a nitride, silicon nitride, silicon oxide, SiON, SiC, SiOCN, or SiBCN. In some embodiments of the invention, the spacers 202 include silicon nitride. The spacers 202 can be formed to a thickness of about 5 to 40 nm, although other thicknesses are within the contemplated scope of the invention.

Figure 3:
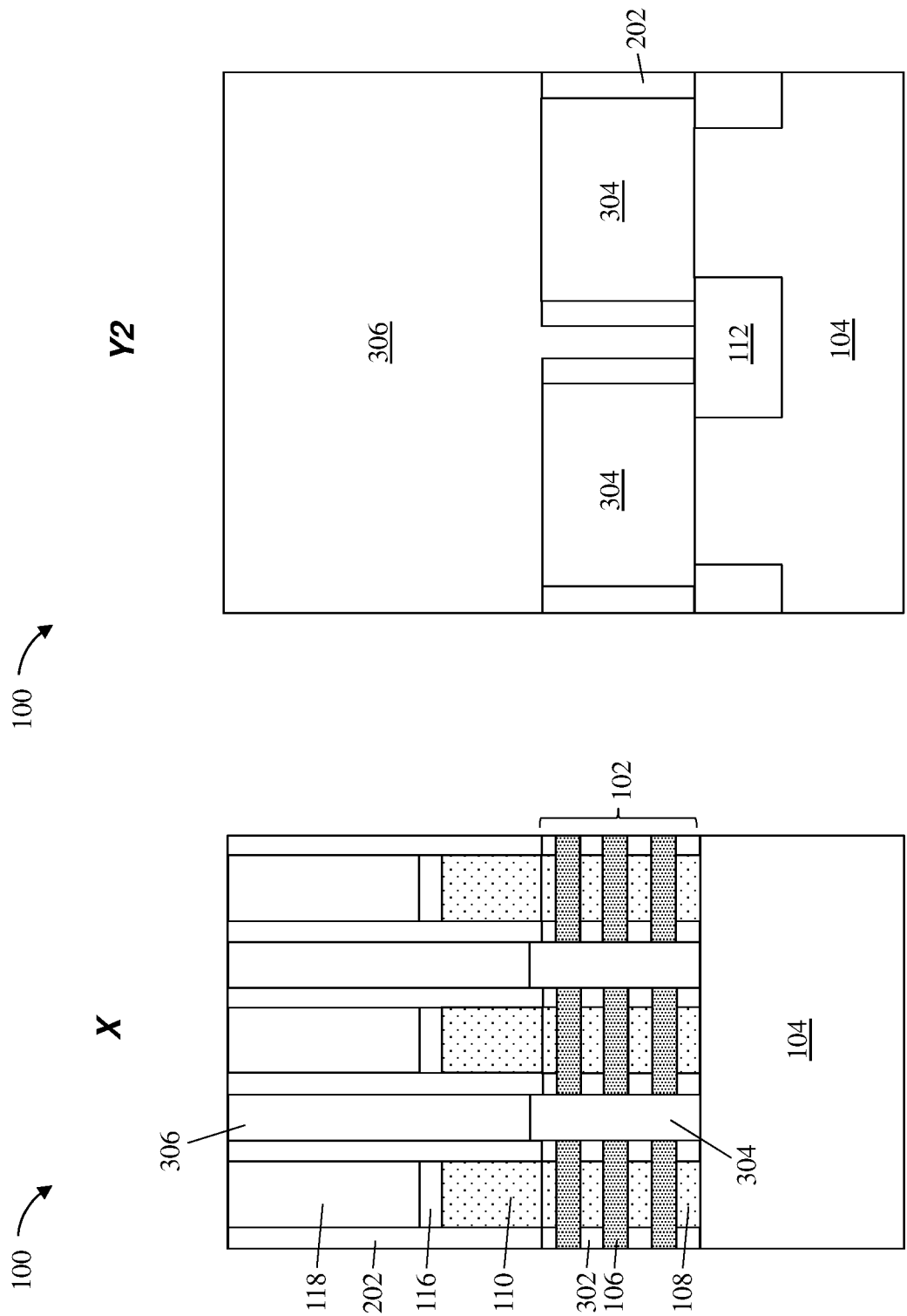
FIG. 3 depicts cross-sectional views of a semiconductor structure along the lines X and Y2 of the reference view after forming inner spacers and source/drain regions according to one or more embodiments of the invention.

FIG. 3 depicts cross-sectional views of the semiconductor structure 100 taken along the lines X and Y2 of the reference view 101 after a processing operation according to one or more embodiments of the invention. In some embodiments of the invention, portions of the nanosheet stacks 102 can be removed (sometimes referred to as a stack recess) to expose a surface of the substrate 104 (or a buried oxide layer if present). The nanosheet stacks 102 can be patterned using, for example, a wet etch, a dry etch, or a combination of wet and/or dry etches. In some embodiments of the invention, the nanosheet stacks 102 is patterned using a RIE. In some embodiments of the invention, the nanosheet stacks 102 is patterned selective to the spacers 202.

In some embodiments of the invention, the sacrificial layers 108 can be recessed and inner spacers 302 can be formed on the recessed sidewalls of the sacrificial layers 108. For example, sidewalls of the sacrificial layers 108 can be recessed to form cavities (not shown) in the nanosheet stacks 102. In some embodiments of the invention, the inner spacers 302 are formed on recessed sidewalls of the sacrificial layers 108 by filling these cavities with dielectric material. In some embodiments of the invention, portions of the inner spacers 302 that extend beyond sidewalls of the nanosheet stack 206 are removed, using, for example, by an isotropic etching process. In this manner, sidewalls of the inner spacers 302 are coplanar to sidewalls of the semiconductor layers 106. In some embodiments of the invention, the inner spacers 302 are formed using a CVD, PECVD, ALD, PVD, chemical solution deposition, or other like processes in combination with a wet or dry etch process. The inner spacers 302 can be made of any suitable material, such as, for example, a low-k dielectric, a nitride, silicon nitride, silicon dioxide, SiON, SiC, SiOCN, or SiBCN.

In some embodiments of the invention, source and drain regions 304 are formed on exposed sidewalls of the semiconductor layers 106. The source and drain regions 304 can be epitaxially grown using, for example, vapor-phase epitaxy (VPE), molecular beam epitaxy (MBE), liquid-phase epitaxy (LPE), or other suitable processes. The source and drain regions 304 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 304 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

In some embodiments of the invention, the source and drain regions 304 are made of silicon or silicon germanium. In some embodiments of the invention, the source and drain regions 304 are made of silicon germanium doped with boron to a boron concentration of about 1 to about 15 percent, for example, 2 percent, although other boron concentrations are within the contemplated scope of the invention.

In some embodiments of the invention, an isolation dielectric 306 is formed over the source and drain regions 304. The isolation dielectric 306 can be made of any suitable dielectric material, such as, for example, oxides, a low-k dielectric, nitrides, silicon nitride, silicon oxide, SiON, SiC, SiOCN, and SiBCN. In some embodiments of the invention, the isolation dielectric 306 is deposited over the semiconductor structure 100 and the semiconductor structure 100 is then planarized to a topmost surface of the dielectric spacer 202.

Figure 4:
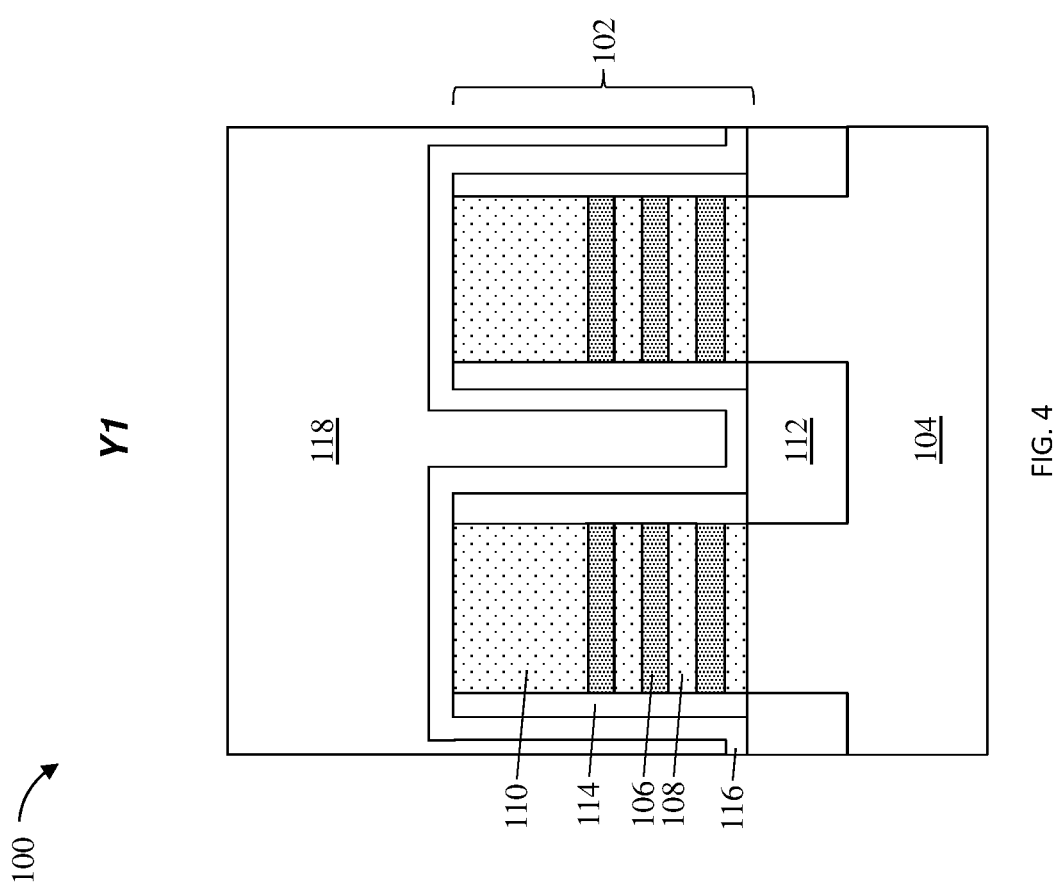
FIG. 4 depicts cross-sectional views of a semiconductor structure along the line Y1 of the reference view after forming inner spacers and source/drain regions according to one or more embodiments of the invention.

FIG. 4 depicts cross-sectional views of the semiconductor structure 100 taken along the line Y1 of the reference view 101 after a processing operation according to one or more embodiments of the invention. From this view, it is clear that portions of the sacrificial spacer 114 remain between the nanosheet stacks 102 and the liner 116 under the sacrificial gate 118.

Figure 5:
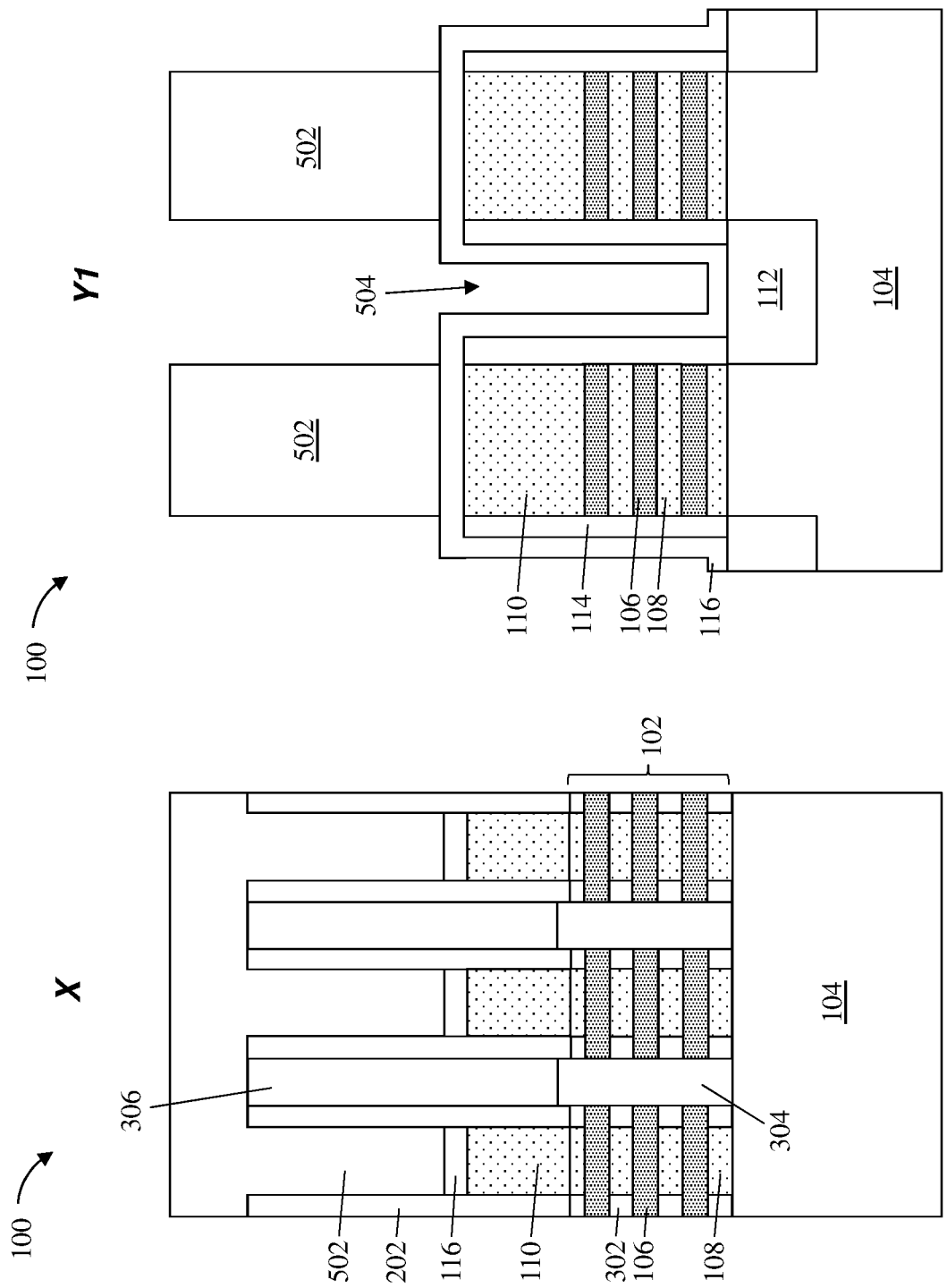
FIG. 5 depicts cross-sectional views of a semiconductor structure along the lines X and Y1 of the reference view after forming and patterning an organic planarization layer according to one or more embodiments of the invention.

FIG. 5 depicts cross-sectional views of the semiconductor structure 100 taken along the lines X and Y1 of the reference view 101 after a processing operation according to one or more embodiments of the invention. In some embodiments of the invention, the sacrificial gates 118 are removed to expose a surface of the liner 116. Any known method for removing a sacrificial gate can be used, such as, for example, a wet etch, a dry etch, or a combination of sequential wet and/or dry etches. In some embodiments of the invention, the sacrificial gates 118 are removed using ammonia wet chemistry (e.g., hot chemical etching).

In some embodiments of the invention, an organic planarization layer (OPL) 502 is coated on the wafer after the sacrificial gates 118 are removed. In some embodiments, the OPL 502 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 502 can include any organic polymer and a photo-active compound having a molecular structure that can attach to the molecular structure of the organic polymer. In some embodiments, the OPL 502 material is selected to be compatible an overlying antireflective coating (not shown) and/or an overlying photoresist (not shown). In some embodiments, the OPL 502 can be applied using spin coating technology, although other techniques are within the contemplated scope of the invention.

As shown in line Y1 in FIG. 5, the OPL 502 can then be patterned to form a trench 504 between nanosheet stacks. The OPL 502 can be patterned using, for example, photolithography followed by a dry etch, or a combination of sequential dry and/or wet etches. In some embodiments of the invention, the OPL 502 is patterned to expose a surface of the liner 116.

Figure 6:
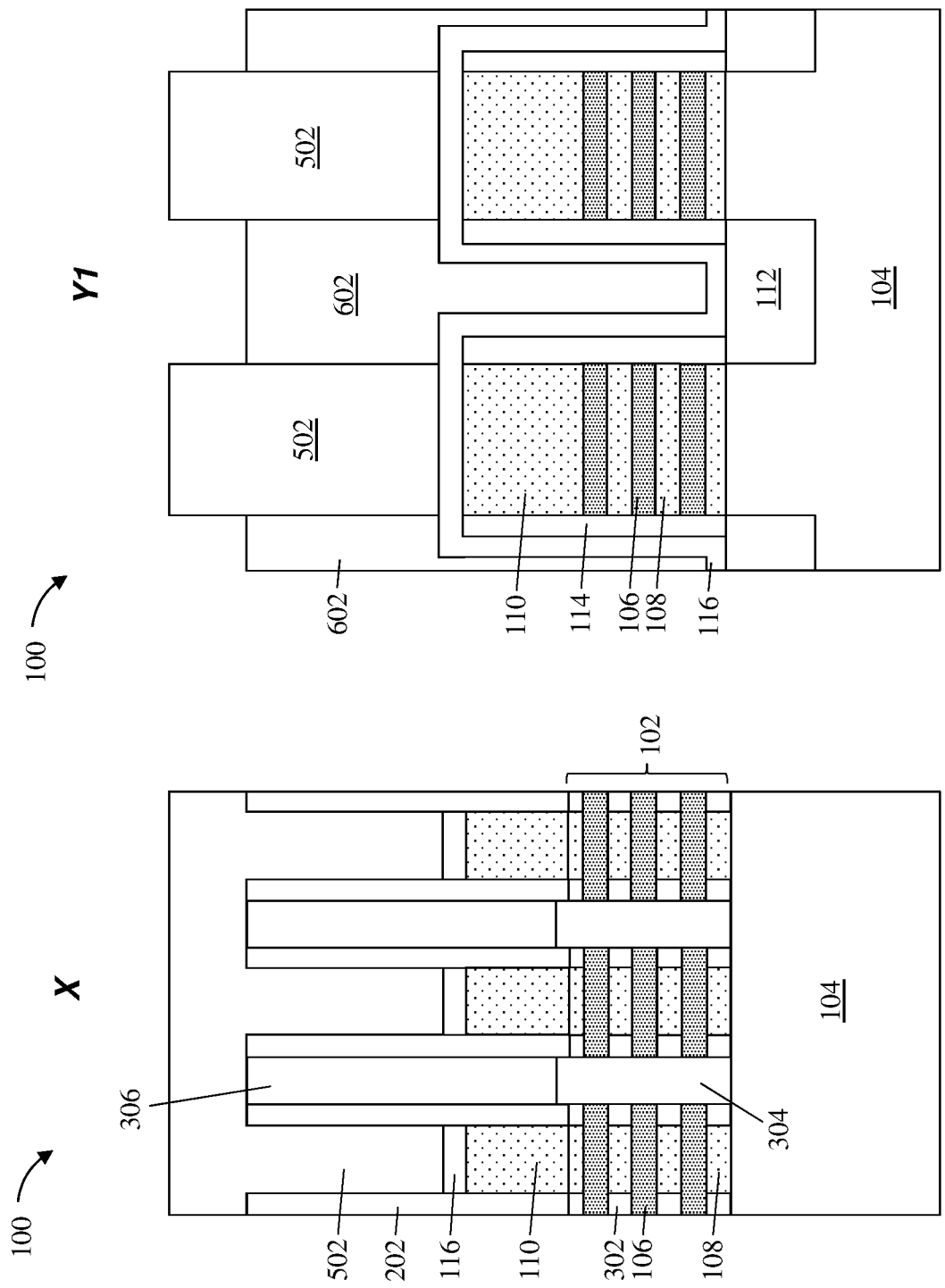
FIG. 6 depicts cross-sectional views of a semiconductor structure along the lines X and Y1 of the reference view after forming an isolation structure according to one or more embodiments of the invention.

FIG. 6 depicts cross-sectional views of the semiconductor structure 100 taken along the lines X and Y1 of the reference view 101 after a processing operation according to one or more embodiments of the invention. In some embodiments of the invention, an isolation structure 602 is formed over the semiconductor structure 100. In some embodiments of the invention, the isolation structure 602 fills the trench 504, electrically isolating the nanosheet stacks 102 from other adjacent devices, such as other nanosheet stacks, or any other active device on the substrate 104. The isolation structure 602 can be made of any suitable dielectric material, such as, for example, a low-k dielectric, a nitride, silicon nitride, silicon oxide, SiON, SiC, SiOCN, or SiBCN. In some embodiments of the invention, the isolation structure 602 includes silicon nitride.

In some embodiments of the invention, the isolation structure 602 includes a lower portion having a first diameter (the portion confined between sidewalls of the liner 116 as shown in FIG. 6) and an upper portion having a second diameter larger than the first diameter (the portion that extends over a topmost surface of the liner 116). As the upper portion is wider than the lower portion, the isolation structure 602 is sometimes referred to as a T-shaped isolation structure. In some embodiments of the invention, the isolation structure 602 is recessed from a top surface of the OPL 502, exposing sidewalls of the OPL 502 as shown along the line Y1.

Figure 7:
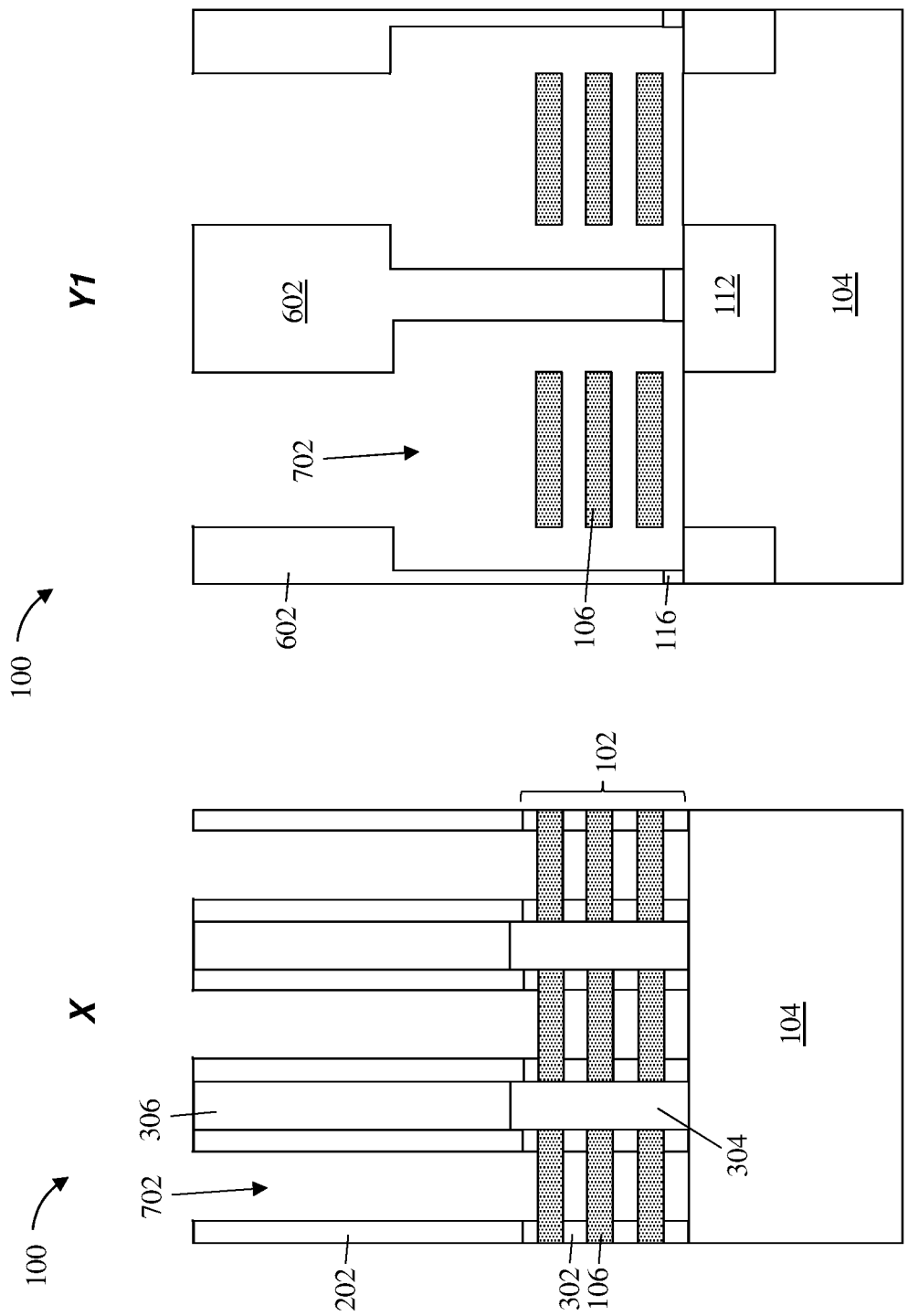
FIG. 7 depicts cross-sectional views of a semiconductor structure along the lines X and Y1 of the reference view after releasing nanosheets according to one or more embodiments of the invention.

FIG. 7 depicts cross-sectional views of the semiconductor structure 100 taken along the lines X and Y1 of the reference view 101 after a processing operation according to one or more embodiments of the invention. In some embodiments of the invention, the OPL 502 is removed to expose portions of the liner 116. The OPL 502 can be removed using, for example, ashing. In some embodiments of the invention, exposed portions of the liner 116 are removed to expose a surface of the topmost sacrificial layer 110.

As further shown in FIG. 7, the topmost sacrificial layer 110, the sacrificial layers 108, and the sacrificial spacer 114 can be removed to form a cavity 702 that releases the semiconductor layers 106 (once released, the semiconductor layers 106 are often referred to as nanosheets). The topmost sacrificial layer 110, the sacrificial layers 108, and the sacrificial spacer 114 can be removed selective to the semiconductor layers 106. For example, when the semiconductor layers 106 are formed of silicon and the topmost sacrificial layer 110, the sacrificial layers 108, and the sacrificial spacer 114 are formed of SiGe, carboxylic acid/nitric acid/HF chemistry, citric acid/nitric acid/HF, and vapor phased HCl, for example, can be utilized to remove SiGe selective to silicon. In another example, when the semiconductor layers 106 are formed of SiGe and the topmost sacrificial layer 110, the sacrificial layers 108, and the sacrificial spacer 114 are formed of silicon, aqueous hydroxide chemistry, including ammonium hydroxide and potassium hydroxide, for example, can be utilized to remove silicon selective to SiGe. In some embodiments of the invention, exposed portions of the liner 116 are also removed, widening the cavity 702. The liner 116 can be removed using, for example, an HK preclean. Widening the cavity 702 can improve gap-filling when forming the conductive gate (FIG. 8).

Figure 8:
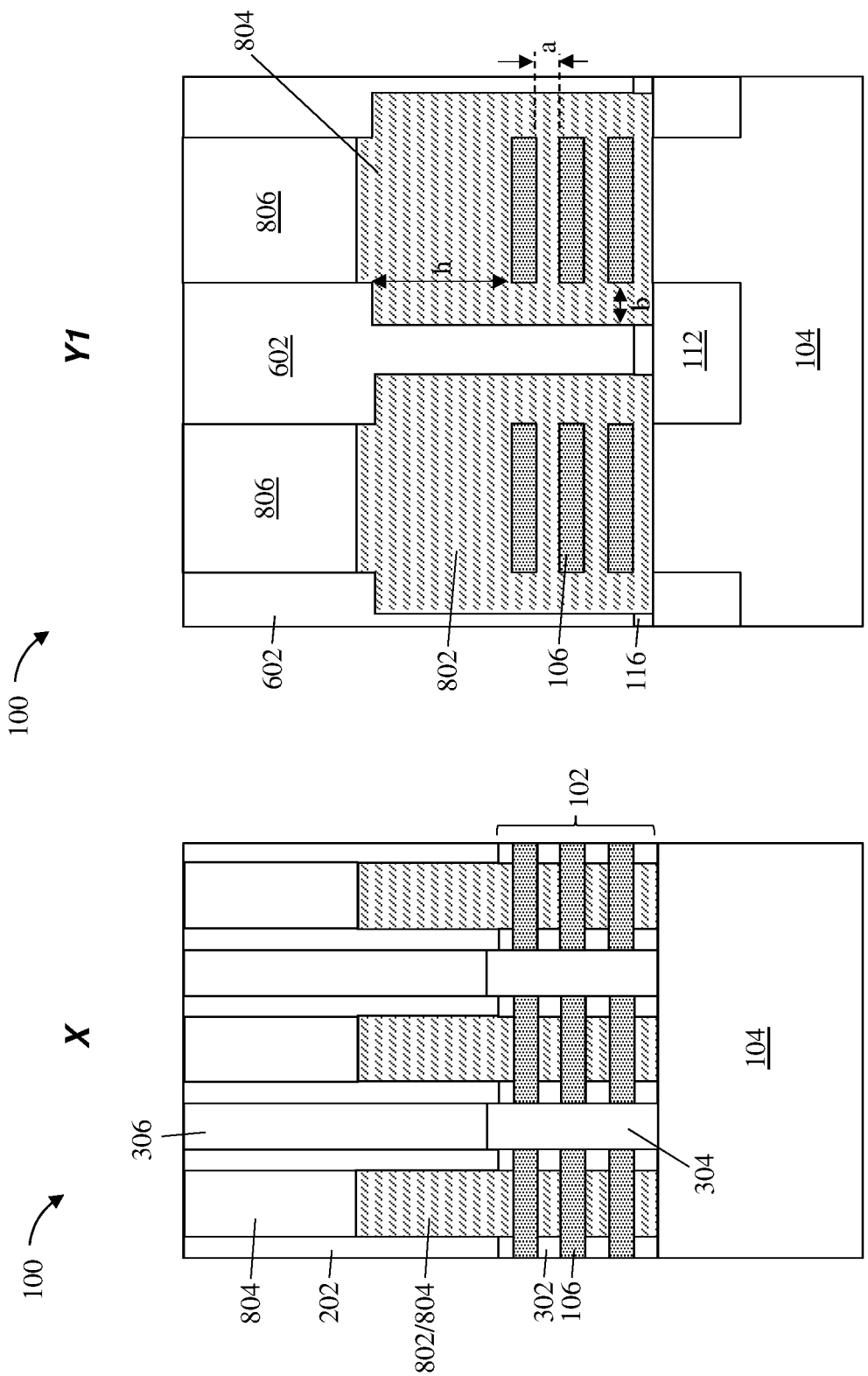
FIG. 8 depicts cross-sectional views of a semiconductor structure along the lines X and Y1 of the reference view after forming conductive gates according to one or more embodiments of the invention.

FIG. 8 depicts cross-sectional views of the semiconductor structure 100 taken along the lines X and Y1 of the reference view 101 after a processing operation according to one or more embodiments of the invention. As shown in FIG. 8, gates 802 and 804 (sometimes referred to as metal gates or conductive gates) are formed in the cavity 702.

The gates 802 and 804 can be high-k metal gates (HKMGs) formed over a channel region of the nanosheet stacks 102 using, for example, known replacement metal gate (RMG) processes, or so-called gate-first processes. As used herein, the "channel region" refers to the portion of the semiconductor layers 106 over which the gates 802 and 804 are formed, and through which a current passes from source to drain in the final device. In some embodiments of the invention, the gates 802 and 804 are formed by depositing high-k/metal gate materials into the cavity 702 (shown in FIG. 7).

In some embodiments of the invention, the gates 802 are NFET gate stacks and the gates 804 are PFET gate stacks. In some embodiments of the invention, the gates 802 and 804 can include a gate dielectric(s) (not shown) and a work function metal stack (not shown). In some embodiments, the gates 802 and 804 include a main body formed from bulk conductive gate material(s).

In some embodiments of the invention, the gate dielectric is a high-k dielectric film formed on a surface (sidewall) of the semiconductor layers 106. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 802 and 804 include one or more work function layers (sometimes referred to as a work function metal stack) formed between the high-k dielectric film and a bulk gate material. In some embodiments of the invention, the gates 802 and 804 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 802 and 804 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 802 and 804 include a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

As further depicted in FIG. 8, gate hard masks 806 can be formed over the gates 802 and 804. The gate hard masks 806 can be made of any suitable material, such as, for example, silicon nitride. In some embodiments of the invention, the gate hard masks 806 are formed by recessing the gates 802 and 804, exposing sidewalls of the spacers 202 (X cross-section) and sidewalls of the isolation structure 602 (Y1 cross-section). The gate hard masks 806 can then be formed or deposited on the recessed surface of the gates 802 and 804. In this manner, the gate hard masks 806 are aligned to the gates 802 and 804 in the space between the spacers 202 and the isolation structure 602. Consequently, the gate hard masks 806 can be thought of as self-aligned hard masks (sometimes referred to as SAC caps). The gate hard masks 806 are self-aligned to both the spacers 202 and the isolation structure 602, allowing for almost perfect alignment as well as extremely small critical dimensions of the gate hard masks 806 for cell scaling.

Figure 9:
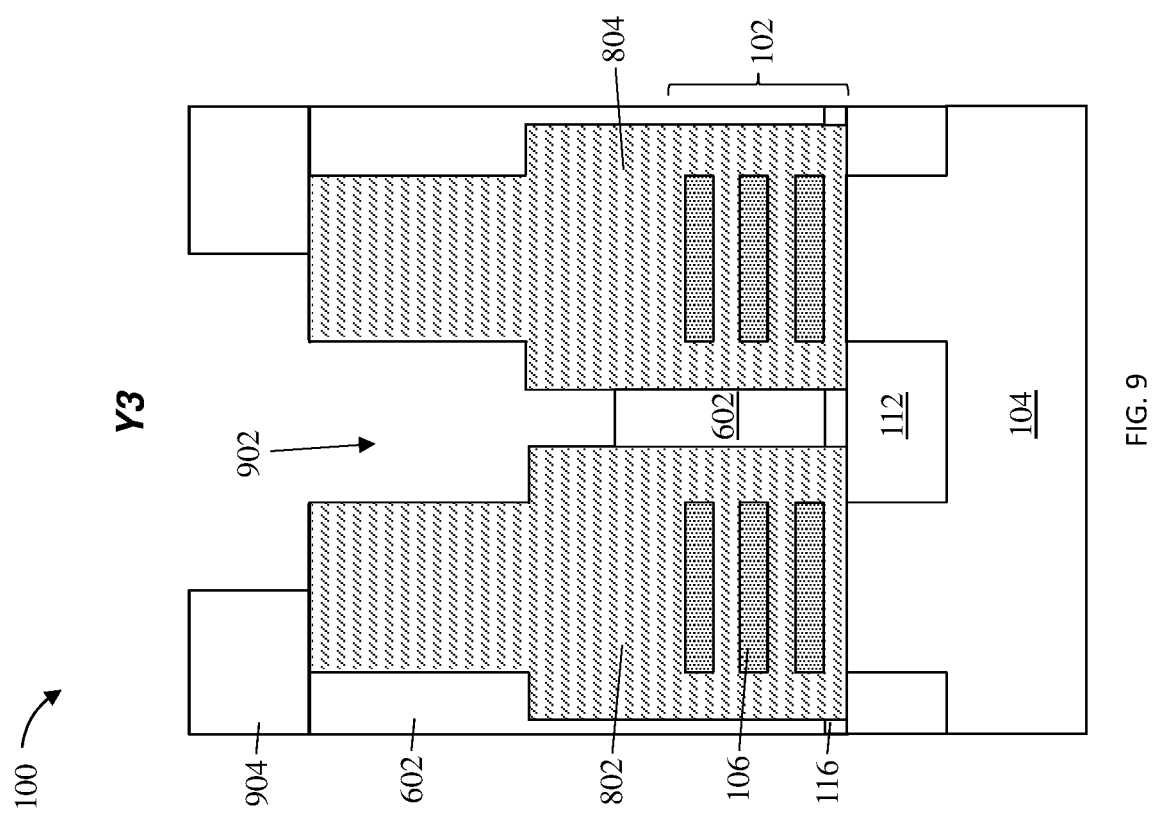
FIG. 9 depicts cross-sectional views of a semiconductor structure along the line Y3 of the reference view after recessing the isolation structure according to one or more embodiments of the invention.
Figure 10:
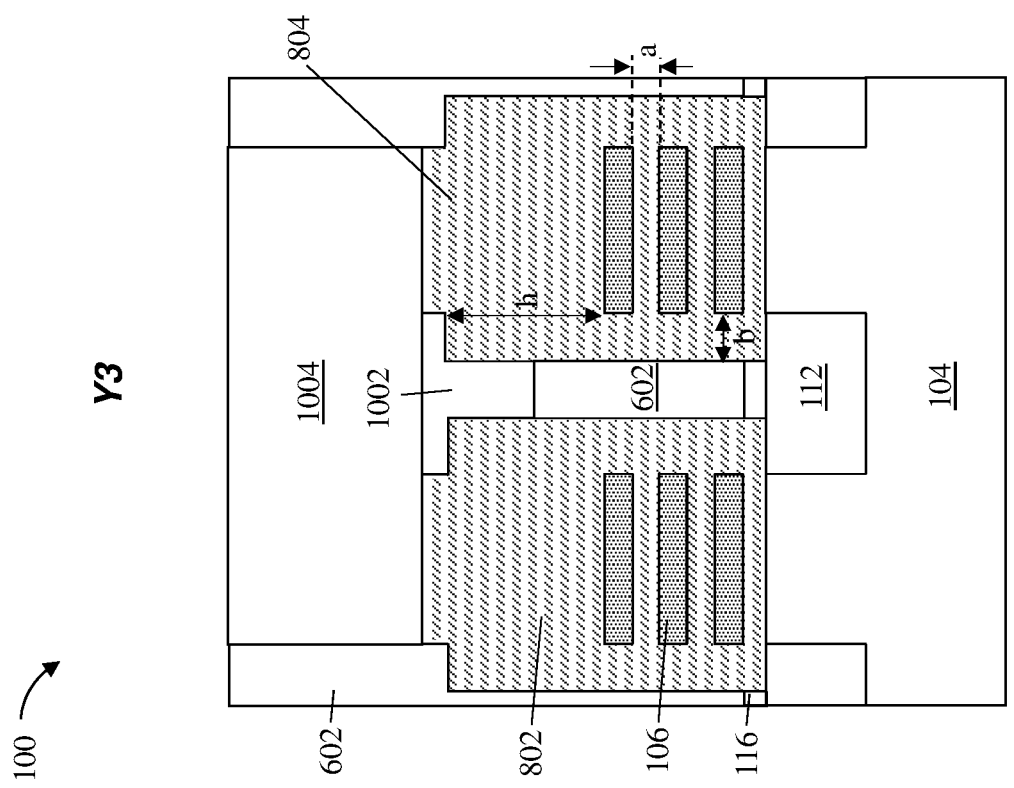
FIG. 10 depicts cross-sectional views of a semiconductor structure along the line Y3 of the reference view after forming a shared gate structure according to one or more embodiments of the invention.

FIG. 9 depicts a cross-sectional view of the semiconductor structure 100 taken along the line Y3 of the reference view 101 after a processing operation according to one or more embodiments of the invention. FIGS. 9 and 10 follow from FIG. 7, but describe an alternative to the processing steps shown in FIG. 8. In contrast to the process shown in FIG. 8 (which is used to form individual, or cut gate devices), the process shown in FIGS. 9 and 10 are used to form shared gate devices. It should be understood that both cut gate and shared gates devices, in any combination, can be formed on the substrate 104 using the process schemes described in FIGS. 1-10. In some embodiments of the invention, only cut gate devices, only shared gate devices, or a combination of cut gate and shared gate devices are formed on the substrate 104.

As shown in FIG. 9, portions of the isolation structure 602 can be recessed to form a cavity 902 between adjacent gates of the gates 802 and 804. The isolation structure 602 can be recessed using any suitable process, such as, for example, a wet etch, a dry etch, or a combination of wet and/or dry etches. In some embodiments of the invention, a mask 904 is formed over the semiconductor structure 100 and the mask 904 is used to pattern the isolation structure 602. For example, the mask 904 can be patterned using known techniques, such as photolithography, and this pattern can be transferred to the isolation structure 602. Pattern transfer can include, for example, a wet etch, a dry etch, or a combination of wet and/or dry etches.

FIG. 10 depicts a cross-sectional view of the semiconductor structure 100 taken along the line Y3 of the reference view 101 after a processing operation according to one or more embodiments of the invention. In some embodiments of the invention, a conductive structure 1002 is formed on a recessed surface of the isolation structure 602. The conductive structure 1002 serves to short the gate 802 (e.g., NFET gate stacks) to the gate 804 (e.g., PFET gate stacks), defining a shared gate device. As shown in FIG. 10, the conductive structure 1002 includes a bottom portion confined between sidewalls of the gates 802 and 804 and a top portion that sits on the bottom portion and extends over a portion of the gates 802 and 804. Due to this configuration (a relatively wide upper portion positioned on a narrow bottom portion) the conductive structure 1002 is sometimes referred to as a T-shaped metallization. As shown in FIG. 10, a first distance "h" measured from a bottom surface of the top portion of the conductive structure 1002 to a topmost surface of a topmost nanosheet in the nanosheet stacks 102 is greater than a distance "b" measured from a sidewall of the nanosheet stacks 102 to a sidewall of the isolation structure 602. As further shown in FIG. 10, the distance "b" is greater than a distance "a", defined as the space between nanosheets.

The conductive structure 1002 can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition. In some embodiments of the invention, the conductive structure 1002 includes tungsten.

As further shown in FIG. 10, a gate hard mask 1004 can be formed over the gates 802 and 804 and the conductive structure 1002. The gate hard mask 1004 can be formed in a similar manner and using a similar process as the gate hard masks 806 (as described with respect to FIG. 8). The gate hard masks 1004 can be made of any suitable material, such as, for example, silicon nitride. In some embodiments of the invention, the gate hard masks 1004 are formed by recessing the gates 802 and 804 and the conductive structure 1002, exposing sidewalls of the isolation structure 602 (Y3 cross-section). The gate hard masks 1004 can then be formed or deposited on the recessed surfaced of the gates 802 and 804.

Figure 11:
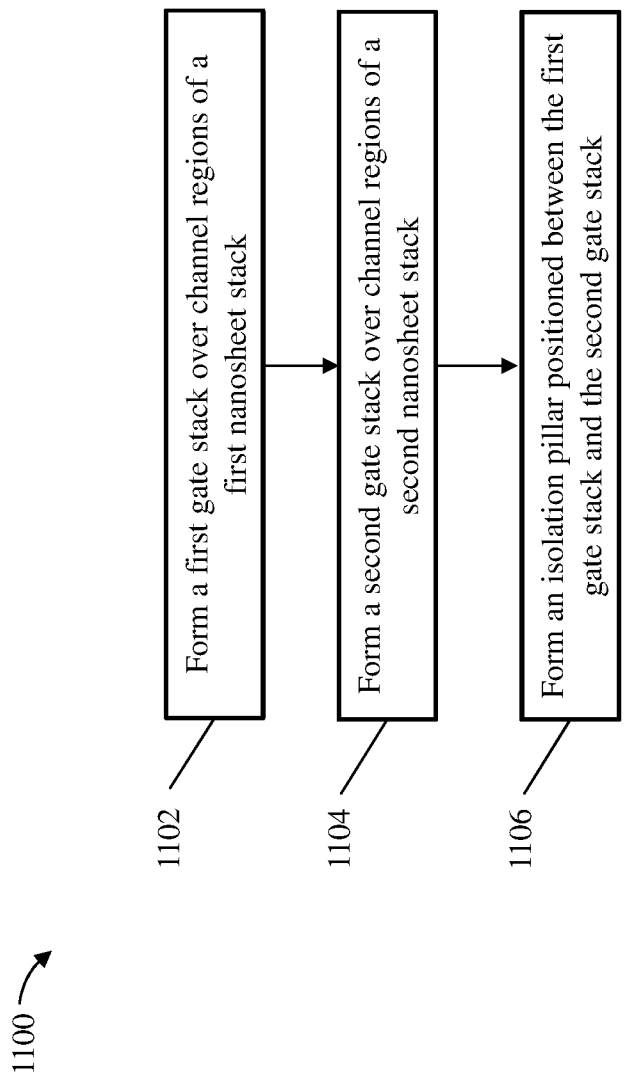
FIG. 11 depicts a flow diagram illustrating a method according to one or more embodiments of the invention.

FIG. 11 depicts a flow diagram 1100 illustrating a method for forming a semiconductor device according to one or more embodiments of the invention. As shown at block 1102, a first gate stack is formed over channel regions of a first nanosheet stack. At block 1104, a second gate stack is formed over channel regions of a second nanosheet stack. In some embodiments of the invention, the first gate stack includes an n-type gate stack and the second gate stack includes a p-type gate stack.

At block 1106, an isolation pillar is positioned between the first gate stack and the second gate stack. In some embodiments of the invention, the isolation pillar includes a top portion having a first width and a bottom portion having a second width less than the first width.

In some embodiments of the invention, a first distance between a bottom surface of the top portion of the isolation pillar and a top surface of a topmost nanosheet is larger than a second distance between a sidewall of the topmost nanosheet and the bottom portion of the isolation pillar. In some embodiments of the invention, the second distance is larger than a third distance defined as the space between nanosheets (i.e., the vertical edge-to-edge spacing between adjacent nanosheets).

The method can further include forming a first SAC cap positioned on a surface of the first gate stack and a second SAC cap positioned on a surface of the second gate stack. In some embodiments of the invention, a top surface of the top portion of the isolation pillar is coplanar to a surface of the SAC cap. In some embodiments of the invention, a bottom surface of the bottom portion is in direct contact with a shallow trench isolation region.

In some embodiments of the invention, the top portion of the isolation pillar is removed and the bottom portion of the isolation pillar is recessed. In some embodiments of the invention, a conductive structure is formed on the recessed surface of the isolation pillar. The conductive structure shorts the first gate stack to the second gate stack, thereby providing a shared gate device. In some embodiments of the invention, the conductive structure includes a top portion having a first width and a bottom portion having a second width less than the first width. In some embodiments of the invention, the top portion extends over portions of the first gate stack and portions of the second gate stack.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a first gate stack over channel regions of a first nanosheet stack;
    forming a second gate stack over channel regions of a second nanosheet stack; and
    forming an isolation pillar positioned between the first gate stack and the second gate stack; and
    forming a conductive structure on the isolation pillar, the conductive structure comprising a top portion having a first width and a bottom portion having a second width less than the first width, the top portion extending over portions of the first gate stack and portions of the second gate stack.

2. The method of claim 1, wherein a first distance between a bottom surface of the top portion of the conductive structure and a top surface of a topmost nanosheet is larger than a second distance between a sidewall of the topmost nanosheet and the bottom portion of the isolation pillar.

3. The method of claim 2, wherein the second distance is larger than a third distance, the third distance defined as a vertical spacing between nanosheets.

4. The method of claim 1 further comprising forming a first self-aligned contact (SAC) cap positioned on a surface of the first gate stack and on a surface of the second gate stack.

5. The method of claim 4, wherein a top surface of the top portion of the conductive structure is coplanar to a surface of the SAC cap.

6. The method of claim 1, wherein the first gate stack comprises an n-type gate stack and the second gate stack comprises a p-type gate stack.

7. The method of claim 6 further comprising removing a top portion of the isolation pillar.

8. The method of claim 7 further comprising recessing a bottom portion of the isolation pillar.

9. The method of claim 8 further comprising forming the conductive structure on the recessed surface of the isolation pillar.

10. A semiconductor device comprising:
    an n-type gate stack over channel regions of a first nanosheet stack;
    a p-type gate stack over channel regions of a second nanosheet stack;
    an isolation pillar positioned between the n-type gate stack and the p-type gate stack; and
    a conductive structure on the isolation pillar, the conductive structure comprising a top portion having a first width and a bottom portion having a second width less than the first width, the top portion extending over portions of the n-type gate stack and portions of the p-type gate stack.

11. The semiconductor device of claim 10, wherein a first distance between a bottom surface of the top portion of the conductive structure and a top surface of a topmost nanosheet is larger than a second distance between a sidewall of the topmost nanosheet and the bottom portion of the conductive structure.

12. The semiconductor device of claim 11, wherein the second distance is larger than a third distance, the third distance defined as the space between nanosheets.

13. The semiconductor device of claim 10 further comprising a self-aligned contact (SAC) cap positioned on a surface of the conductive structure, the SAC cap extending onto a surface of the n-type gate stack and a surface of the p-type gate stack.

14. The semiconductor device of claim 13, wherein a top surface of the isolation pillar is in direct contact with the conductive structure, and wherein a bottom surface of the isolation pillar is in direct contact with a shallow trench isolation region.

* * * * *